United States Patent
Guedon et al.

(10) Patent No.: US 11,408,923 B2
(45) Date of Patent: Aug. 9, 2022

(54) CIRCUIT AND METHOD FOR MEASURING POWER DISSIPATION IN A RECTIFIER

(71) Applicant: STMicroelectronics Asia Pacific Pte Ltd, Singapore (SG)

(72) Inventors: Yannick Guedon, Singapore (SG); Teerasak Lee, Singapore (SG); Supriya Raveendra Hegde, Scotland (GB)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 17/016,963

(22) Filed: Sep. 10, 2020

(65) Prior Publication Data

US 2021/0088567 A1 Mar. 25, 2021

Related U.S. Application Data

(60) Provisional application No. 62/904,078, filed on Sep. 23, 2019.

(51) Int. Cl.
| | |
|---|---|
| *G01R 27/08* | (2006.01) |
| *H02J 50/80* | (2016.01) |
| *H02M 7/219* | (2006.01) |
| *H02M 1/00* | (2006.01) |

(52) U.S. Cl.
CPC .............. *G01R 27/08* (2013.01); *H02J 50/80* (2016.02); *H02M 1/00* (2013.01); *H02M 7/219* (2013.01); *H02M 1/0009* (2021.05)

(58) Field of Classification Search
CPC ........ H01L 21/00; H01L 2221/00; G01R 1/00
See application file for complete search history.

(56) References Cited

U.S. PATENT DOCUMENTS

| | | | | |
|---|---|---|---|---|
| 2009/0039869 | A1* | 2/2009 | Williams | ................ H01L 24/48 324/123 R |
| 2011/0248702 | A1* | 10/2011 | Kume | ................ G01R 19/0092 324/119 |
| 2012/0206064 | A1* | 8/2012 | Archenhold | ......... H05B 45/385 315/297 |

(Continued)

*Primary Examiner* — Jermele M Hollington
*Assistant Examiner* — Temilade S Rhodes-Vivour
(74) *Attorney, Agent, or Firm* — Crowe & Dunlevy

(57) ABSTRACT

A receiver circuit includes a rectifier operable in full-, half-synchronous and asynchronous modes. A measurement circuit, with method, provides for real-time power measurement within the rectifier. The measurements are made based on the average output current from the rectifier delivered to the load and measurements sampled over time of the instantaneous voltage at each input/output node of the rectifier. Equivalent resistance in the rectifier is determined from the measurements and power dissipation calculated from the determined equivalent resistance and the average output current. The instantaneous voltages are synchronously captured through high-voltage AC coupling in order to detect the voltage drop across each element of the rectifier. The sensed voltages are amplified in the low voltage domain and converted by a high-speed analog-to-digital converter in order to produce data useful in computing equivalent resistance values. From these values, power dissipation within the rectifier is calculated and real-time equivalent resistance is available.

18 Claims, 10 Drawing Sheets

(56) References Cited

U.S. PATENT DOCUMENTS

| | | | |
|---|---|---|---|
| 2014/0225439 A1* | 8/2014 | Mao | H02J 7/0029 307/31 |
| 2016/0036340 A1* | 2/2016 | Kikuchi | H02M 1/32 363/21.14 |
| 2017/0338969 A1* | 11/2017 | Paul | G06F 1/26 |

* cited by examiner

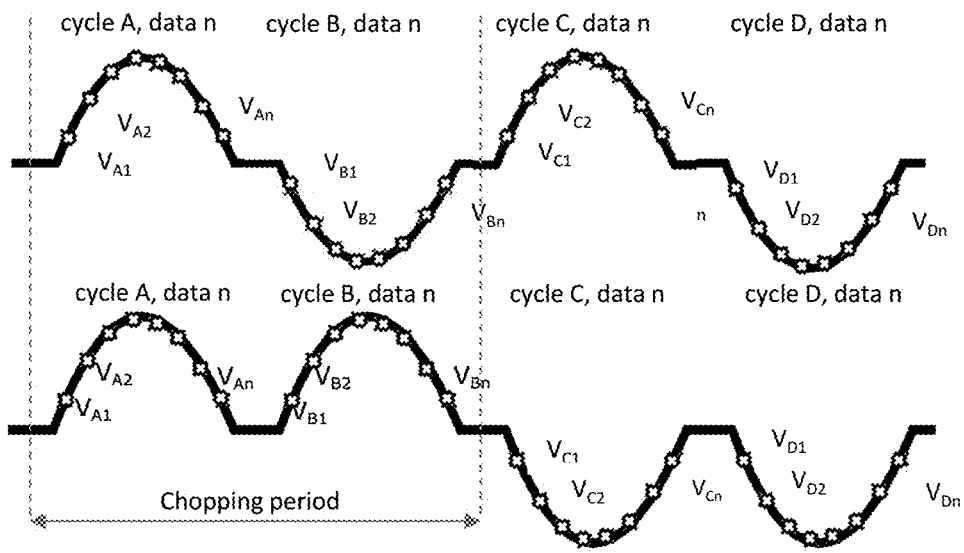
FIG. 10
FIG. 11
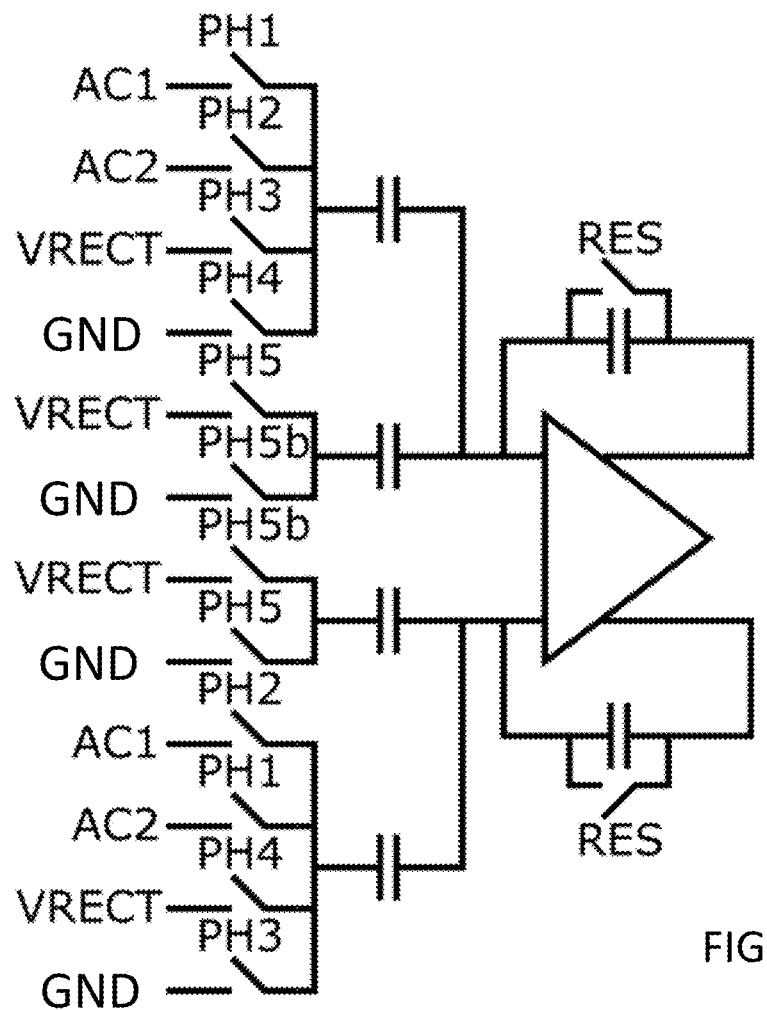
FIG. 12

CIRCUIT AND METHOD FOR MEASURING POWER DISSIPATION IN A RECTIFIER

CROSS REFERENCE TO RELATED APPLICATIONS

This application claims priority from U.S. Provisional Application Pat. No. 62/904,078 filed Sep. 23, 2019, the disclosure of which is incorporated by reference.

TECHNICAL FIELD

The present invention generally relates to a rectifier circuit and, in particular, to the measurement of power dissipation in the rectifier circuit.

BACKGROUND

Wireless power transfer systems are well known in the art. FIG. 1 shows a schematic view of such a system. A wireless charging unit receives a DC input at a transmit circuit that is coupled to a first coil. A wireless device (for example, a cellular telephone) includes a second coil coupled to a receive circuit which generates a DC output used, for example, to charge a battery of the wireless device. The first and second coils are arranged in an adjoining relationship which supports electromagnetic coupling. This electromagnetic coupling is used in connection with the transfer of power from the wireless charging unit to the wireless device, and may further support the bi-directional communication of data between the wireless charging unit and the wireless device.

Some industry protocols have been developed which specify how the transmit circuit and the receive circuit are to communicate with each other so as support an adjustment in the supply and demand of power. The industry protocols define how bi-directional data communications are supported using in-band communication (i.e., over the transformer formed by the first and second coils). There are also industry protocols which support out-of-band communication through techniques such as Bluetooth. No matter which technology is used, those skilled in the art recognize that there are safety considerations which must be addressed.

FIG. 2 shows a circuit diagram for a wireless power transfer system. The operation of the system is as follows: 1) AC mains voltage is converted into a high frequency alternating current at the transmitter by transmitting elements; 2) the high frequency alternating current is applied to the first (primary) coil Lp; 3) the alternating current flowing within the first (primary) coil Lp creates a magnetic field which extends to the second (secondary) coil Ls over a power transfer interface (provided the first and second coils are within a specified distance of each other); 4) the magnetic field generates a current in the second (secondary) coil Ls of the receiver; 5) current flowing in the second (secondary) coil Ls is converted to a direct current by the receiving elements (for example, a rectifier circuit, not shown, see FIGS. 3); and 6) the direct current is applied to a load $Z_L$ (for example, a battery which is charged).

FIG. 3 shows a circuit diagram for a generic diode-based rectifier circuit including a rectification bridge and a voltage regulator circuit. In a preferred implementation, the power transmitter PTx will only generate as much power as is needed (requested) by the power receiver PRx. This is where the bi-directional data communication becomes important. The power receiver PRx can communicate with the power transmitter PTx for the purpose of managing power transfer. For example, the power receiver PRx can specify how much power is needed from the power transmitter PTx. Or, the power receiver PRx can provide operational information to the power transmitter PTx, with the power transmitter PTx processing that information to determine how much power transfer is needed.

Steady-state operation of the system relies on equilibrium between transmitted power from power transmitter PTx side and consumed power at power receiver PRx side. To some degree, both the power transmitter PTx and the power receiver PRx must have the technical ability to evaluate their own losses. On the power receiver PRx side, the losses include coil losses, rectifier losses, regulator (for example, low drop-out LDO) losses, and receiver circuitry losses, while power is transmitted to the load. On power transmitter PTx side, the losses include coil losses, rectification bridge losses, and transmit circuitry losses. While LDO losses and receiver circuitry losses are generally measured as part of the whole power outgoing from the rectifier (measured at the level of the rectification voltage VRECT), the coil losses and rectifier losses generally speaking must be "estimated" losses. This is also the case for coil losses and rectification bridge losses at the power transmitter PTx side.

Coil losses are pure resistive losses. Generally the coil resistance DCR is characterized and the system does a calculation of the power losses in the coil by calculating $DCR*I^2$. While the current measurement made by the transmit and receive circuits can be precise (using precise/calibrated embedded current sensors), the accuracy of the power estimation is limited, however, to the precision of the coil resistance measurement (+/−10% at best due to manufacturing dispersions). Also, this does not take into consideration the dependency of the resistance to temperature variations.

Rectifier losses are generally characterized once on a bench. From this characterization, an equivalent resistance Req of the rectifying circuit element (such as a MOSFET device) is extrapolated and the tabulated data (which can be current dependent) is stored in a non-volatile memory (NVM) within the receiver circuit. From there, the calculation of power losses can be calculated using $Req*I^2$. The precision of the estimation, however, is also limited to the variations of the on-resistance (Rdson) of the transistors of the rectifier, with process and temperature.

There is accordingly a need in the art for a technique for making an accurate measurement of the power losses in the rectifier.

SUMMARY

In an embodiment, a circuit measures power dissipation in a voltage rectifier that includes four MOSFET transistors arranged in a bridge with a first input terminal, a second input terminal, a first output terminal and a second output terminal. The circuit comprises: a current sensing circuit configured to sense current delivered from the first output terminal of the rectifier towards a load; and a voltage measurement circuit configured to sense a voltage drop across each transistor in the bridge synchronous with actuation of the transistor during a rectification mode operation for the voltage rectifier.

In an embodiment, a voltage rectifier is formed by four MOSFET transistors arranged in a bridge with a first input terminal, a second input terminal, a first output terminal and a second output terminal. A method for measuring power dissipation in the voltage rectifier comprises: sensing current delivered from the first output terminal of the rectifier towards a load; sensing a voltage drop across each MOSFET transistor in the bridge; wherein sensing is performed synchronous with actuation of the MOSFET transistor during a rectification mode operation for the voltage rectifier; and calculating power dissipation from the sensed current and voltage drops.

BRIEF DESCRIPTION OF THE DRAWINGS

For a better understanding of the embodiments, reference will now be made by way of example only to the accompanying figures in which:

FIGS. 10 and 11 shown chopping operations;

FIG. 12 is a circuit diagram for a voltage measurement amplifier circuit; and

DETAILED DESCRIPTION

Figure 1:
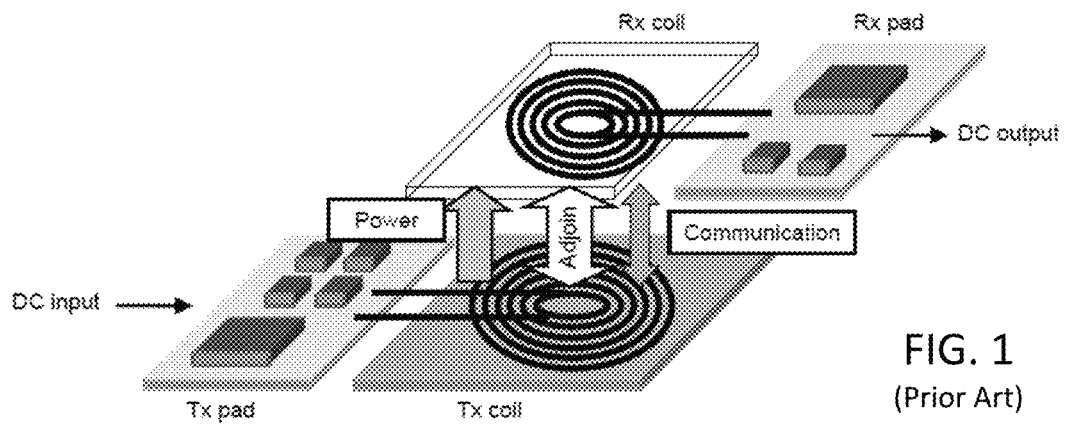
FIG. 1 is a schematic view of a wireless power transfer system.
Figure 2:
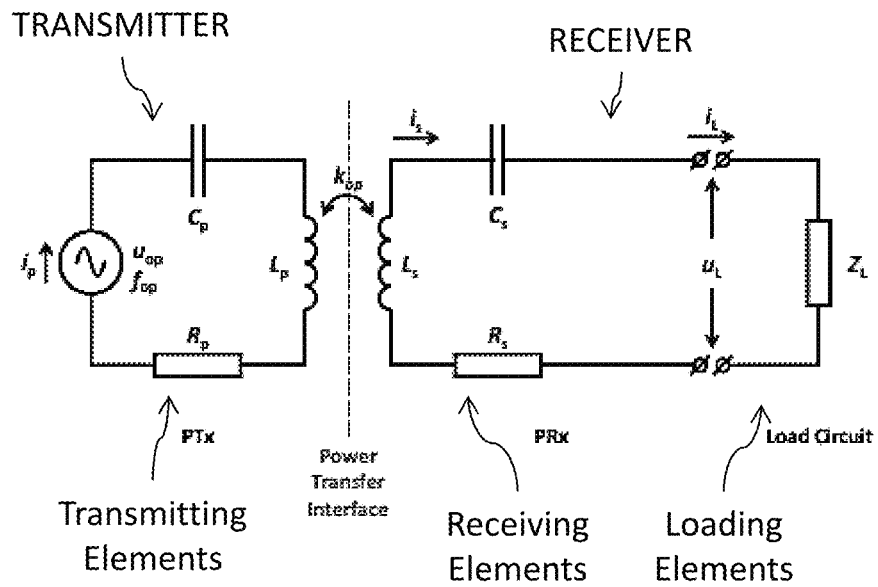
FIG. 2 is a circuit diagram for a wireless power transfer system.
Figure 3:
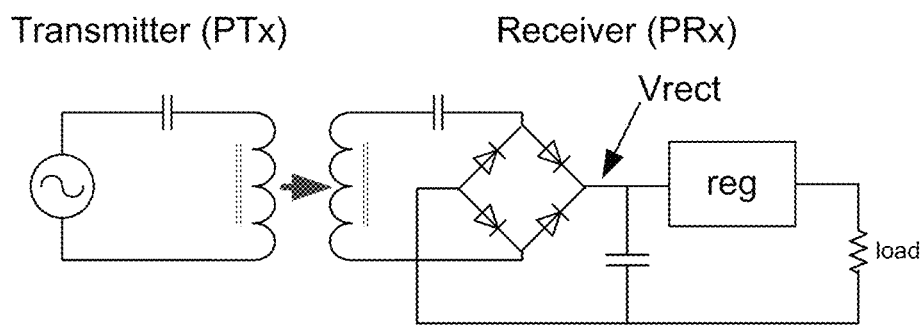
FIG. 3 is a circuit diagram for a generic rectifier circuit.
Figure 4:
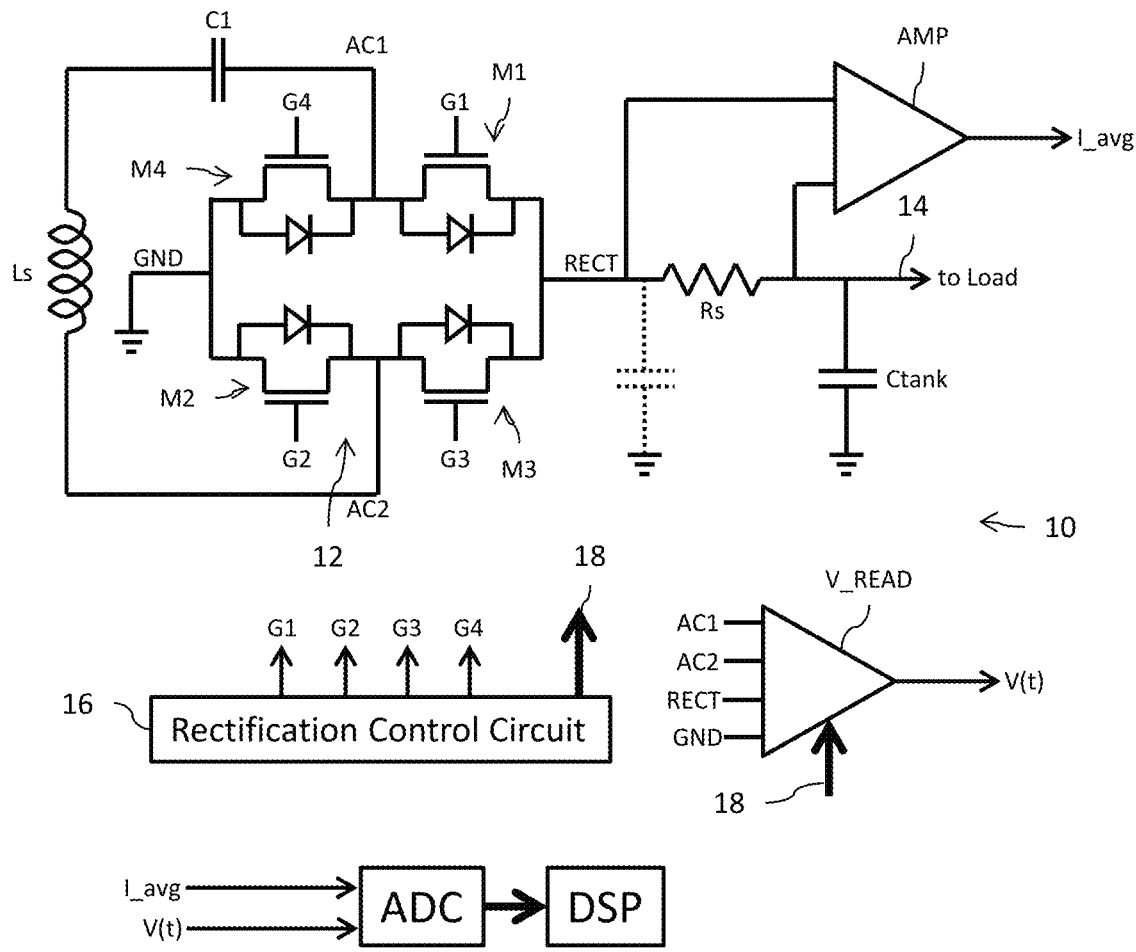
FIG. 4 is a circuit diagram for a power dissipation measurement circuit for a rectifier.

Reference is now made to FIG. 4 which shows a circuit diagram for a power dissipation measurement circuit 10 configured to make power dissipation measurements on a rectifier circuit 12. The rectifier circuit 12 is an active transistor-based bridge rectifier having a first input (terminal) AC1 and a second input (terminal) AC2 configured to receive an AC input voltage generated by a secondary coil Ls and capacitor C1 which are coupled in series between the first input AC1 and second input AC2. The secondary coil Ls may, for example, be associated with a power transfer system (see, FIGS. 1-3). The bridge rectifier circuit 12 further includes a first output (terminal) RECT and second output (terminal) GND configured to generate a rectified DC output voltage. A first transistor (for example, an n-channel MOSFET) M1 of the bridge rectifier circuit 12 has a source connected to the first input AC1 and a drain connected to the first output RECT. A second transistor (for example, an n-channel MOSFET) M2 of the bridge rectifier circuit 12 has a source connected to the second output GND (coupled to a DC ground reference) and a drain connected to the second input AC2. A third transistor (for example, an n-channel MOSFET) M3 of the bridge rectifier circuit 12 has a source connected to the second input AC2 and a drain connected to the first output RECT. A fourth transistor (for example, an n-channel MOSFET) M4 of the bridge rectifier circuit 12 has a source connected to the second output GND and a drain connected to the first input AC1. The parasitic diodes of the transistors M1-M4 are also shown.

The gate terminals of the transistors M1-M4 in the rectifier circuit 12 are driven by corresponding gate signals G1-G4 generated by a rectification control circuit 16. When operating in switching mode to rectify the A/C signal present at the input nodes AC1 and AC2, the rectification control circuit 16 alternately actuates pairs of transistors. For example, simultaneously actuating transistors M1 and M2 in a first phase (corresponding to a positive phase of the A/C signal) and then simultaneously actuating transistors M3 and M4 in a second phase (corresponding to a negative phase of the A/C signal). The sequence of first and second phase actuations is repeated and the rectified A/C signal is output at the first output RECT.

A sense resistor Rs is coupled between the first output RECT and an output node 14. A tank capacitor Ctank is coupled between output node 14 and the DC ground reference. A differential amplifier AMP has a first input coupled on one side of the sense resistor Rs (for example, associated with first output RECT) and a second input coupled on another side of the sense resistor Rs (for example, associated with output node 14). The differential amplifier AMP senses the voltage drop across sense resistor Rs which is indicative of current I_avg delivered by the bridge rectifier circuit 12 to the load (this current corresponding to the current flowing through the actuated pair of transistors during switched rectification operation). It is to be noted that the current is named I_avg as the amplifier is generally constructed to include a filtering circuit so as to deliver an average value of the current. Moreover another tank capacitor could be coupled between output RECT and the DC ground reference for even further filtering the current before it flows in the sensing resistance Rs.

A voltage reading circuit V_READ is configured to selectively read the voltages at the terminals of the bridge rectifier circuit 12 and generate an output voltage V(t) as a function of the read voltages. The voltage reading circuit V_READ has a first input coupled to the first input AC1, a second input coupled to the second input AC2, a third input coupled to the first output RECT and a fourth input coupled to the second output GND. As will be shown in more detail herein, the connections from the terminals of the measurement circuitry of the voltage reading circuit V_READ are capacitive couplings.

A control circuit 16 is configured to generate the control signals G1-G4 for selectively actuating the MOSFETs M1-M4, respectively, and further generate voltage reader control signals 18 applied to control the operation of the voltage reading circuit V_READ in a manner which corresponds to the actuation of pairs of transistors during switched rectification operation.

The voltage reading circuit V_READ operates to generate as the output voltage V(t): a) an instantaneous voltage V(RECT,AC1) when control signal G1 is asserted at the gate of transistor M1 (the voltage V(RECT,AC1) being the difference in voltage between RECT and AC1 which is indicative of the on-resistance (Rdson) for actuated transistor M1 during rectification operation because it is specifically when M1 is conducting current that M1 is dissipating power); b) an instantaneous voltage V(AC2,GND) when control signal G2 is asserted at the gate of transistor M2 (the voltage V(AC2,GND) being the difference in voltage between AC2 and GND which is indicative of the on-resistance (Rdson) for actuated transistor M2 during rectification operation because it is specifically when M2 is conducting current that M2 is dissipating power); c) an instantaneous voltage V(RECT,AC2) when control signal G3 is asserted at the gate of transistor M3 (the voltage V(RECT,AC2) being the difference in voltage between RECT and AC2 which is indicative of the on-resistance (Rdson) for actuated transistor M3 during rectification operation because it is specifically when M3 is conducting current that M3 is dissipating power); and d) an instantaneous voltage V(AC1,GND) when control signal G4 is asserted at the gate of transistor M4 (the voltage V(AC1, GND) being the difference in voltage between AC1 and GND which is indicative of the on-resistance (Rdson) for actuated transistor M4 during rectification operation because it is specifically when M4 is conducting current that M4 is dissipating power).

The current I_avg and output voltage V(t) are sampled and converted by an analog-to-digital converter (ADC) to generate digital values for processing in a digital signal processor (DSP). It has to be appreciated that while V(t) may be sampled a few times within the associated period of conduction of the MOSFETs, I_avg may be sampled very seldomly as it is a filtered, and therefore steady, value. In other words, while V(t) is sampled a few times within the time conduction of transistor M1 (respectively, M2, M3, M4), the current I_avg is sampled only once as the system is relying on the pseudo-static nature of the current.

Figure 5:
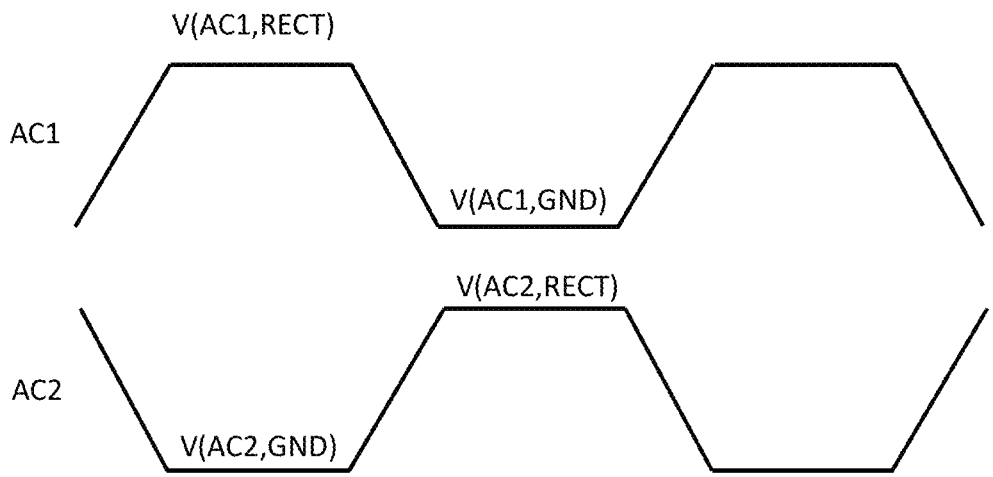
FIG. 5 illustrates AC waveforms along indications of the timing for making voltage measurements relative to the rectifier circuit terminals.

FIG. 5 illustrates the AC waveforms at nodes AC1 and AC2 along with indications of the timing for voltage reading circuit V_READ operation to make the measurements for the instantaneous voltage V(RECT,AC1), instantaneous voltage V(AC2,GND), instantaneous voltage V(RECT, AC1) and instantaneous voltage V(AC1,GND) relative to the A/C signals at the input terminals AC1, AC2 of the bridge rectifier circuit 14.

In a first implementation, as shown in FIGS. 6A-6D, the voltage reading circuit V_READ comprises a plurality of multi-synced auto-zeroed amplifier circuits for making the V(RECT,AC1), V(AC2,GND), V(RECT,AC2) and V(AC1, GND) voltage measurements.

Figure 6A:
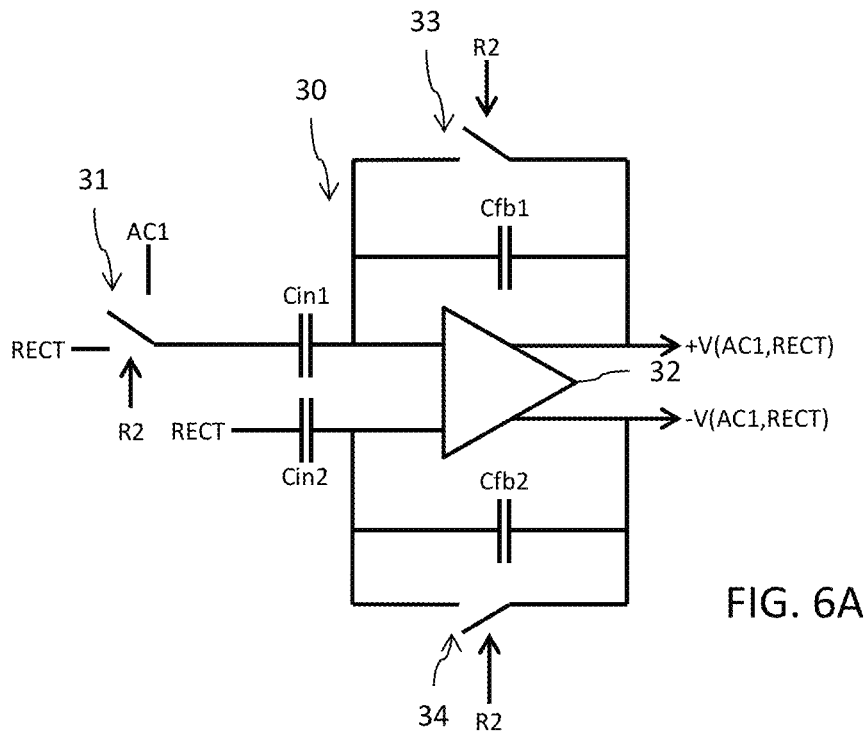
FIGS. 6A-6F are circuit diagrams for voltage measurement amplifier circuits.

FIG. 6A shows a circuit diagram for the multi-synced auto-zeroed amplifier circuit 30 used to make the instantaneous voltage V(RECT,AC1) measurement. The amplifier circuit 30 includes a switching circuit 31 controlled by a control signal R2 to select between connection to the AC1 terminal and the RECT terminal of the rectifier circuit 14. The control signal R2 is one of the voltage reader control signals 18 generated by the control circuit 16. When the control signal R2 is in a first logic state, the RECT terminal is selected for connection through a DC blocking capacitor Cin1 to a first input of a differential amplifier 32. When control signal R2 is in a second logic state, the AC1 terminal is selected for connection through the capacitor Cin1 to the first input of the single-ended amplifier 32. The RECT terminal is connected through a DC blocking capacitor Cin2 to a second input of the differential amplifier 32. A first differential output (+) of the differential amplifier 32 is coupled to the first input through a first feedback capacitor Cfb1. A switching circuit 33 is coupled in parallel with the feedback capacitor Cfb1 and is controlled by the control signal R2 to directly connect the first differential output to the first input when control signal R2 is in the first logic state. Similarly, a second differential output (−) of the differential amplifier 32 is coupled to the second input through a second feedback capacitor Cfb2. A switching circuit 34 is coupled in parallel with the feedback capacitor Cfb2 and is controlled by the control signal R2 to directly connect the second differential output to the second input when control signal R2 is in the first logic state. The amplifier circuit 30 operates in response to the control signal R2 in the first logic state to reset the first and second differential output to the voltage at the RECT terminal of the rectifier 14. Conversely, when the control signal R2 is in the second logic state the amplifier circuit 30 operates to sample the voltage at the AC1 terminal and the output is the voltage difference between the voltages V(AC1) and V(RECT). This measurement is made when gate signal G1 is asserted to turn on transistor M1, and thus the voltage measurement being made is indicative of the on-resistance of transistor M1. Those skilled in the art will appreciate that the differential amplifier should be equipped of an output common mode feedback control circuitry which is not explicitly represented but is known in the art.

Figure 6B:
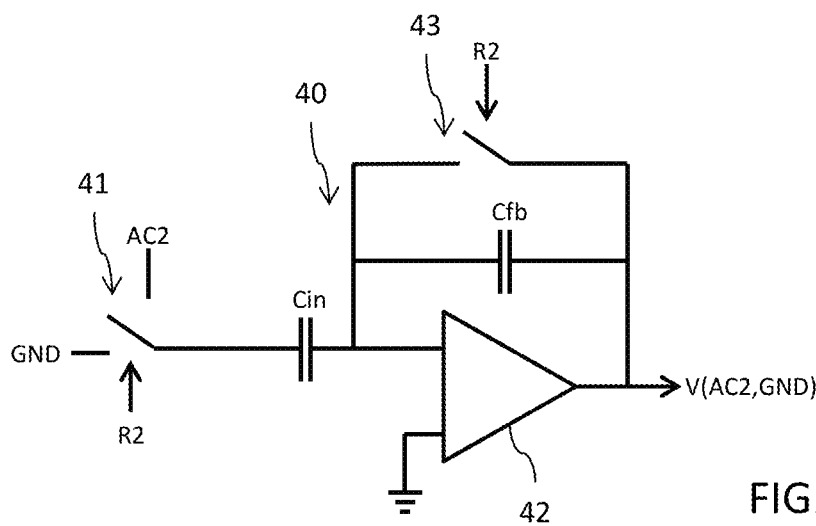

FIG. 6B shows a circuit diagram for the multi-synced auto-zeroed amplifier circuit 40 used to make the instantaneous voltage V(AC2,GND) measurement. The amplifier circuit 40 includes a switching circuit 41 controlled by a control signal R2 to select between connection to the AC2 terminal and the GND terminal of the rectifier circuit 14. The control signal R2 is one of the voltage reader control signals 18 generated by the control circuit 16. When control signal R2 is in a first logic state, the GND terminal is selected for connection through a DC blocking capacitor Cin to a first input of a single ended amplifier 42. When control signal R2 is in a second logic state, the AC2 terminal is selected for connection through the capacitor Cin to the first input of the single-ended amplifier 42. A second input of the single ended amplifier 42 is connected to the GND terminal. The single-ended output of the single ended amplifier 42 is coupled to the first input through a feedback capacitor Cfb. A switching circuit 43 is coupled in parallel with the feedback capacitor Cfb and is controlled by the control signal R2 to directly connect the single-ended output to the first input when control signal R2 is in the first logic state. The amplifier circuit 40 operates in response to the control signal R2 in the first logic state to reset the single-ended output to the voltage at the GND terminal. Conversely, when the control signal R2 is in the second logic state the amplifier circuit 40 operates to sample the voltage at the AC2 terminal and the output is the voltage difference between the voltages V(AC2) and V(GND). This measurement is made when gate signal G2 is asserted to turn on transistor M2, and thus the voltage measurement being made is indicative of the on-resistance of transistor M2.

Figure 6C:
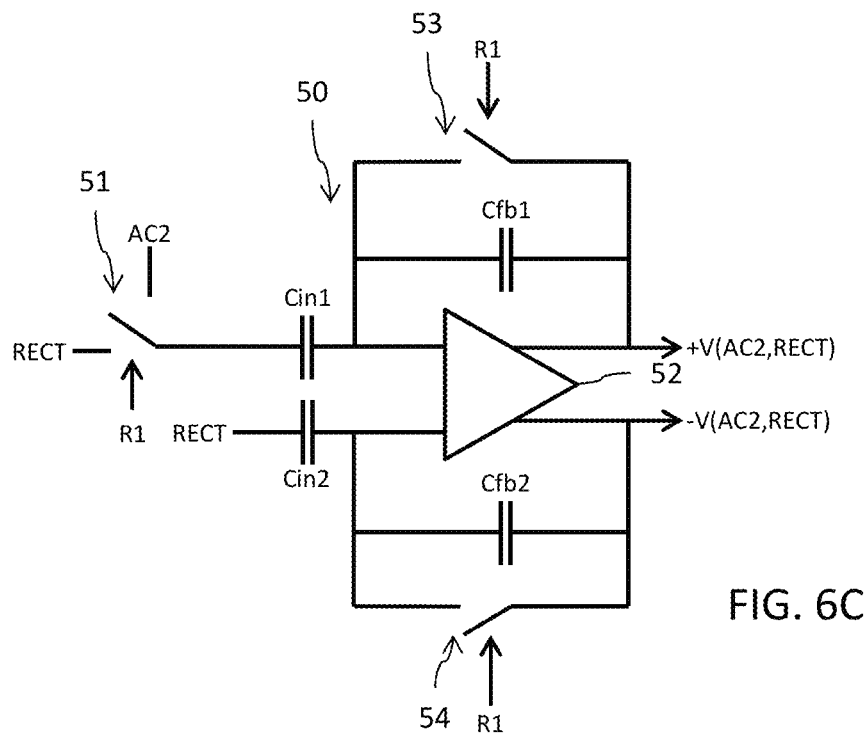

FIG. 6C shows a circuit diagram for the multi-synced auto-zeroed amplifier circuit 50 used to make the instantaneous voltage V(RECT,AC2) measurement. The amplifier circuit 50 includes a switching circuit 51 controlled by a control signal R1 to select between connection to the AC2 terminal and the RECT terminal of the rectifier circuit 14. The control signal R1 is one of the voltage reader control signals 18 generated by the control circuit 16. When the control signal R1 is in a first logic state, the RECT terminal is selected for connection through a DC blocking capacitor Cin1 to a first input of a differential amplifier 52. When control signal R1 is in a second logic state, the AC2 terminal is selected for connection through the capacitor Cin1 to the first input of the differential amplifier 52. The RECT terminal is connected through a DC blocking capacitor Cin2 to a second input of the differential amplifier 52. A first differential output (+) of the differential amplifier 52 is coupled to the first input through a first feedback capacitor Cfb1. A switching circuit 53 is coupled in parallel with the feedback capacitor Cfb1 and is controlled by the control signal R1 to directly connect the first differential output to the first input when control signal R1 is in the first logic state. Similarly, a second differential output (−) of the differential amplifier 52 is coupled to the second input through a second feedback capacitor Cfb2. A switching circuit 54 is coupled in parallel with the feedback capacitor Cfb2 and is controlled by the control signal R1 to directly connect the second differential output to the second input when control signal R1 is in the first logic state. The amplifier circuit 50 operates in response to the control signal R1 in the first logic state to reset the first and second differential output to the voltage at the RECT terminal of the rectifier 14. Conversely, when the control signal R1 is in the second logic state the amplifier circuit 50 operates to sample the voltage at the AC2 terminal and the output is the voltage difference between the voltages V(AC2) and V(RECT). This measurement is made when gate signal G3 is asserted to turn on transistor M3, and thus the voltage measurement being made is indicative of the on-resistance of transistor M3. Those skilled in the art will appreciate that the differential amplifier should be equipped of an output common mode feedback control circuitry which is not explicitly represented but is known in the art.

Figure 6D:
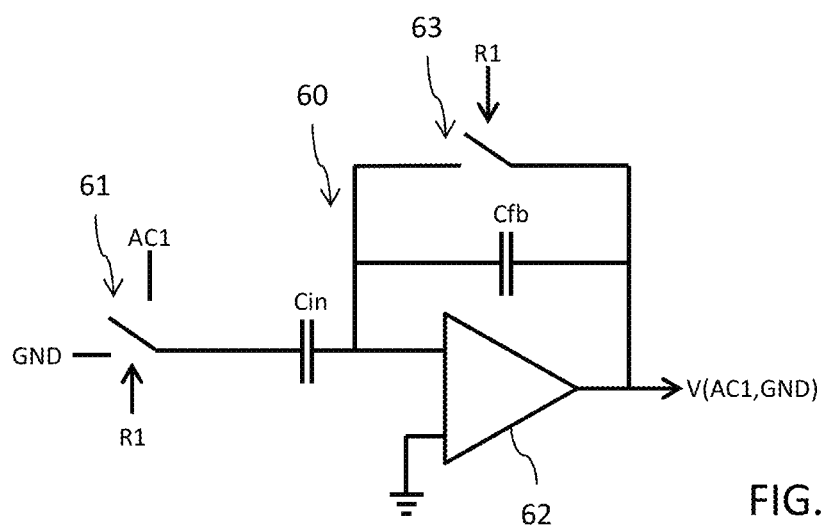

FIG. 6D shows a circuit diagram for the multi-synced auto-zeroed amplifier circuit 60 used to make the instantaneous voltage V(AC1,GND) measurement. The amplifier circuit 60 includes a switching circuit 61 controlled by a control signal R1 to select between connection to the AC1 terminal and the GND terminal of the rectifier circuit 14. The control signal R1 is one of the voltage reader control signals 18 generated by the control circuit 16. When control signal R1 is in a first logic state, the GND terminal is selected for connection through a DC blocking capacitor Cin to a first input of a single ended amplifier 62. When control signal R1 is in a second logic state, the AC1 terminal is selected for connection through the capacitor Cin to the first input of the single-ended amplifier 62. A second input of the single ended amplifier 62 is connected to the GND terminal. The single-ended output of the single ended amplifier 62 is coupled to the first input through a feedback capacitor Cfb. A switching circuit 63 is coupled in parallel with the feedback capacitor Cfb and is controlled by the control signal R1 to directly connect the single-ended output to the first input when control signal R1 is in the first logic state. The amplifier circuit 60 operates in response to the control signal R1 in the first logic state to reset the single-ended output to the voltage at the GND terminal. Conversely, when the control signal R1 is in the second logic state the amplifier circuit 60 operates to sample the voltage at the AC1 terminal and the output is the voltage difference between the voltages V(AC1) and V(GND). This measurement is made when gate signal G4 is asserted to turn on transistor M4, and thus the voltage measurement being made is indicative of the on-resistance of transistor M4.

The gate signals are noted as G1, G2, G3, G4 following the indexing of transistors M1, M2, M3, M4. But, transistors M1, M2 are in conduction at the same time and controlled by the signal ON2, while transistors M1, M2 are in conduction at the same time and controlled by signal ON1. Therefore, R1 and R2 are directly derived from the bridge control signals. When ON1 is asserted high, R2 is also asserted high and the system resets V(AC1,RECT) for FIG. 6A and V(AC2,GND) for FIG. 6B. When ON2 is asserted high in the next period, G3, G4 are also asserted high and the system measures V(AC1,RECT) and V(AC2,GND). The reset and measure period in FIG. 6C and FIG. 6D is simply interleaved with the reset and measure period in FIG. 6A and FIG. 6B.

Figure 7:
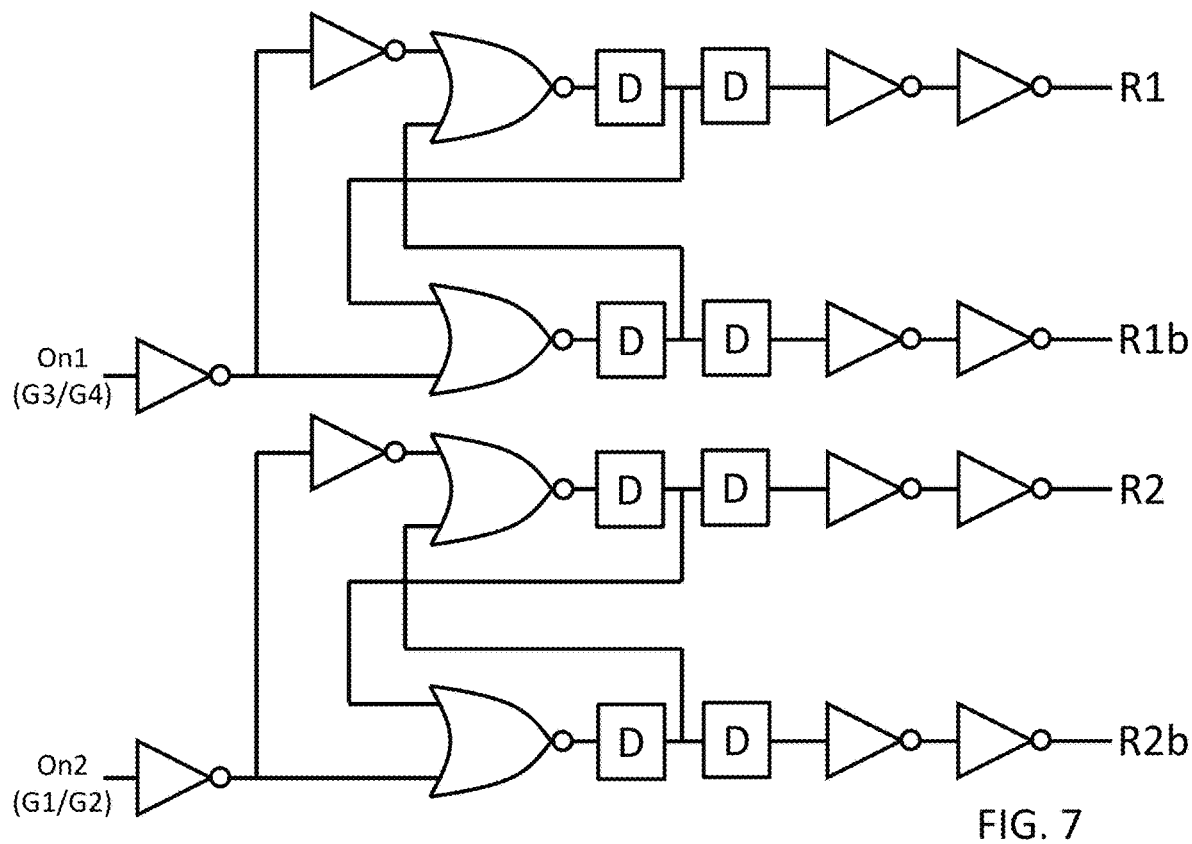
FIG. 7 is a schematic diagram of a logic circuit.

It is important that the voltage reading operation using the multi-synced auto-zeroed amplifier circuits be synchronized to the operation of the rectifier 14. This synchronization is handled by a logic circuit within the control circuit 16. A schematic diagram of the logic circuit is shown in FIG. 7. The logic circuit is configured to generate the control signals R1 and R2 (as well as the logical inversions of those control signals R1b and R2b which may be useful signals in controlling the practical circuit implementations for the switching circuits within the multi-synced auto-zeroed amplifier circuits). The operation of the logic circuit is well understood by one skilled in the art. The reference to "D" is for a delay circuit. With respect to the generation of the R1/R1b signals, the input signal is ON1 which is a signal associated actuating one pair of transistors during rectification operation. With respect to the generation of the R2/R2b signals, the input signal is ON2 which is a signal associated with actuating a different pair of transistors during rectification operation. The logic circuit assures that non-overlapping control signals R1/R1b and R2/R2b are generated whenever one of the switches M1-M4 is actuated.

Figure 8:
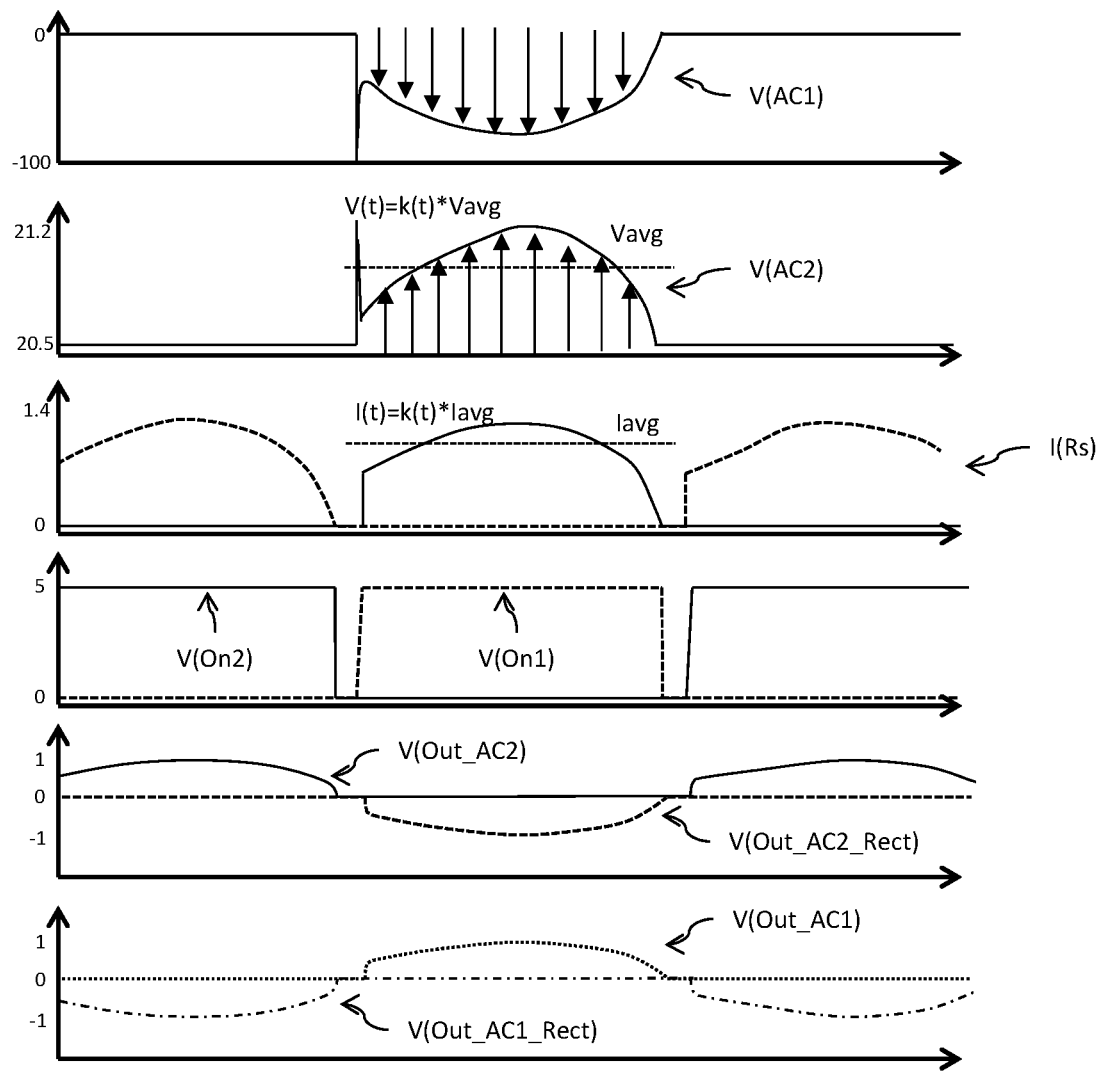
FIGS. 8 and 9 show operational waveforms.

FIG. 8 shows waveforms illustrating operation of the voltage measurement process.

The power measurement method is as follows:

V(t) and I(t) are the instantaneous voltage and current sensed in the conducting elements of the rectifier. The power dissipated in the rectifier is:

$$P = \int \frac{V(t) \cdot I(t) \cdot dt}{T}$$

At any time t: I(t)=k(t)*Iavg

Given that V(t)=Rdson*I(t)

And assuming that Rdson does not vary significantly with current I magnitude, then: V(t)=k(t)*Vavg The power dissipated in the rectifier is:

$$P = \int \frac{V(t) \cdot I(t) \cdot dt}{T} = I_{AVG} \frac{(V_1 * k_1 + V_2 * k_2 + \ldots + V_n * k_n)}{n}$$

From there, power can be derived as:

$$P = \int \frac{V(t) \cdot k(t) \cdot Iavg \cdot dt}{T} = \int \frac{V(t) \cdot V(t) \cdot Iavg \cdot dt}{Vavg \cdot T} = \frac{Iavg}{Vavg} \int \frac{V(t) \cdot V(t) \cdot dt}{T}$$

A method is proposed for reading the actual voltage V(t) and sampling it with n samples, leading to a simplified expression:

$$P = \frac{I_{AVG}}{V_{AVG}} \frac{\sum V_n^2}{n} = I_{AVG} \frac{(V_1 * k_1 + V_2 * k_2 + \ldots + V_n * k_n)}{n} = \frac{I_{AVG}}{V_{AVG}} V_{rms}^2$$

Iavg is read from the current sensor Rs placed between the rectifier and the subsequent circuitry (load). As highlighted previously Iavg is a steady value provided that the current sensor and associated circuitry has enough filtering capability.

Vavg is computed from the average of the n elements Vn.

So, from the foregoing, an equivalent resistance of the dispositive is available in accordance with:

$$Req = \frac{V_{rms}^2}{V_{AVG} * I_{AVG}}$$

To summarize, the process involves: reading voltage drops through high voltage (HV) AC coupling; amplifying in the low voltage (LV) domain with multi synchronized auto-zeroed amplifiers; converting with an ADC to obtain n voltage samples per TX period; computing average voltage Vavg; reading average current Iavg; and computing power dissipation from Vavg, Iavg, and n voltage samples.

Figure 6E:
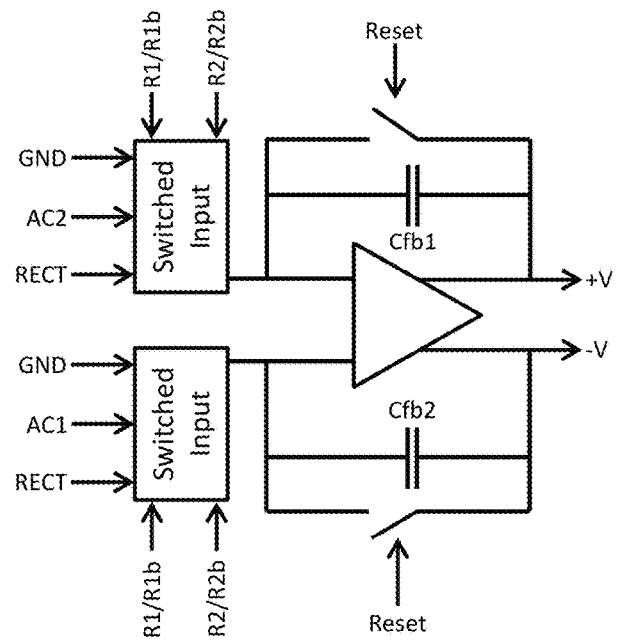
Figure 6F:
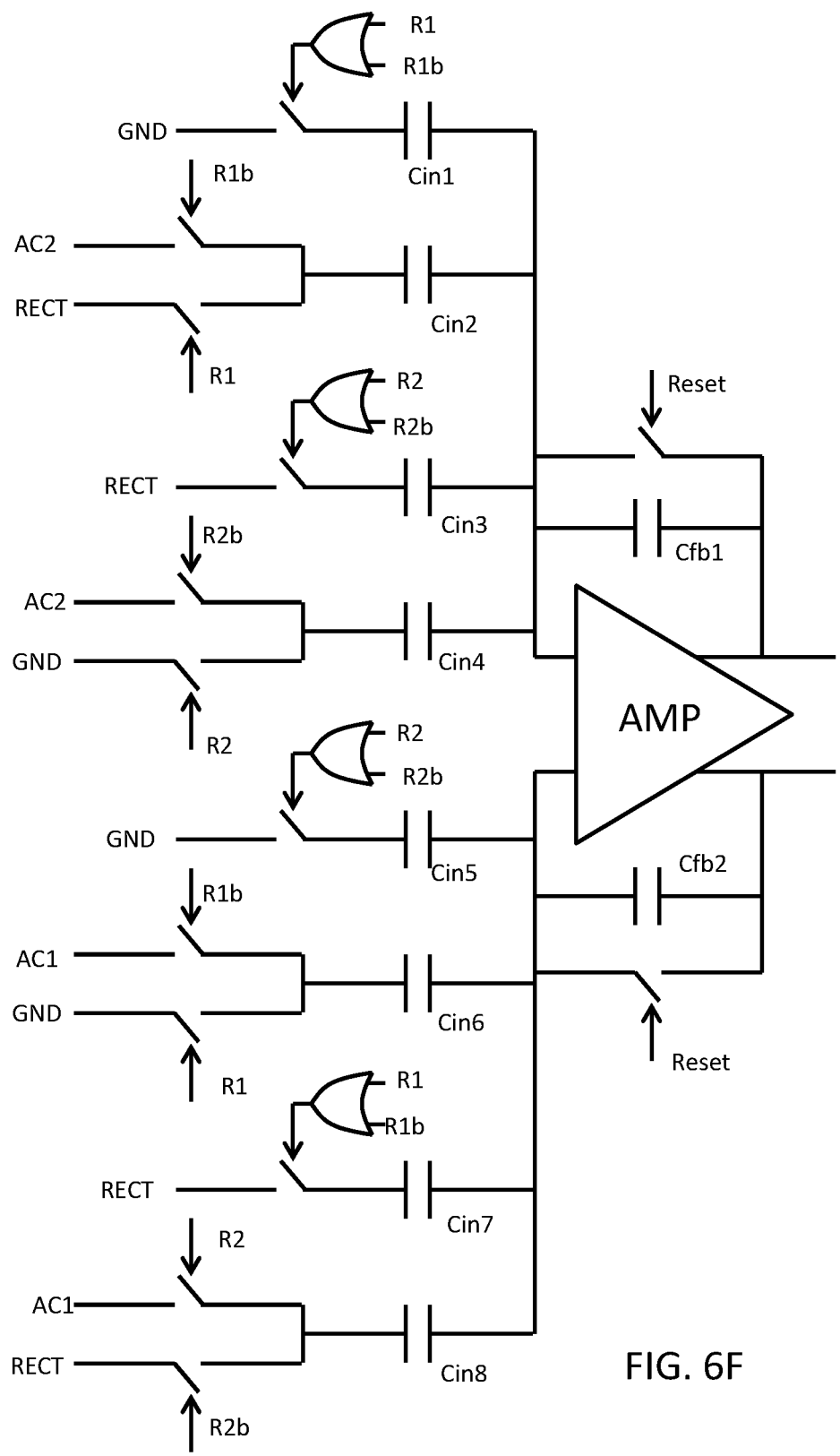

In a second implementation, the plurality of amplifier circuits as shown in FIGS. 6A-6D can be combined together to form a combined synced auto-zeroed amplifier circuit as generally shown in FIG. 6E. A detailed schematic for the amplifier circuit is shown in FIG. 6F. A first switched input receives the voltages at the GND, AC2 and RECT terminals and selectively applies those voltages through a capacitive coupling (Cin1, Cin2, Cin3, Cin4) to a first input of a differential amplifier (AMP) in response to the logic state of the control signals R1/R1b and R2/R2b. A second switched input receives the voltages at the GND, AC1 and RECT terminals and selectively applies those voltages through a capacitive coupling (Cin5, Cin6, Cin7, Cin8) to a second input of the differential amplifier (AMP) in response to the logic state of the control signals R1/R1b and R2/R2b. A first differential output (+) of the differential amplifier is coupled to the first input through a first feedback capacitor Cfb1. A switching circuit is coupled in parallel with the feedback capacitor Cfb1 and is controlled by the control signal Reset to directly connect the first differential output to the first input when control signal Reset is in the first logic state. Similarly, a second differential output (−) of the differential amplifier is coupled to the second input through a second feedback capacitor Cfb2. A switching circuit is coupled in parallel with the feedback capacitor Cfb2 and is controlled by the control signal Reset to directly connect the second differential output to the second input when control signal Reset is in the first logic state. The amplifier circuit operates in response to the control signal Reset in the first logic state to reset the first and second differential output to the voltage at the GND terminal of the rectifier 14. Conversely, when the control signal Reset in the second logic state the amplifier circuit operates to sample a selected voltage at the terminals of the rectifier. As previously highlighted, the differential amplifier should be equipped of an output common mode feedback control circuitry which is not represented for sake of simplicity.

With reference to FIGS. 6A, 6B, 6C and 6D, two amplifiers are measuring voltage while two others are resetting. All four amplifiers can be combined provided that the amplified signals are summed at the output of the amplifier. The combined amplifier will have a shorter time allocated for resetting as it operates to amplify—channels taken 2 by 2—at each cycle. The time for reset is allocated when V(On1) and V(On2) are both at low state. The signals R1/R2/R1b/R2b in FIG. 6E operate identically to the signals in FIGS. 6A-6D, but control signal Reset is used for the reset phase and is generated by logically ANDing signals R1 and R2.

Figure 9:
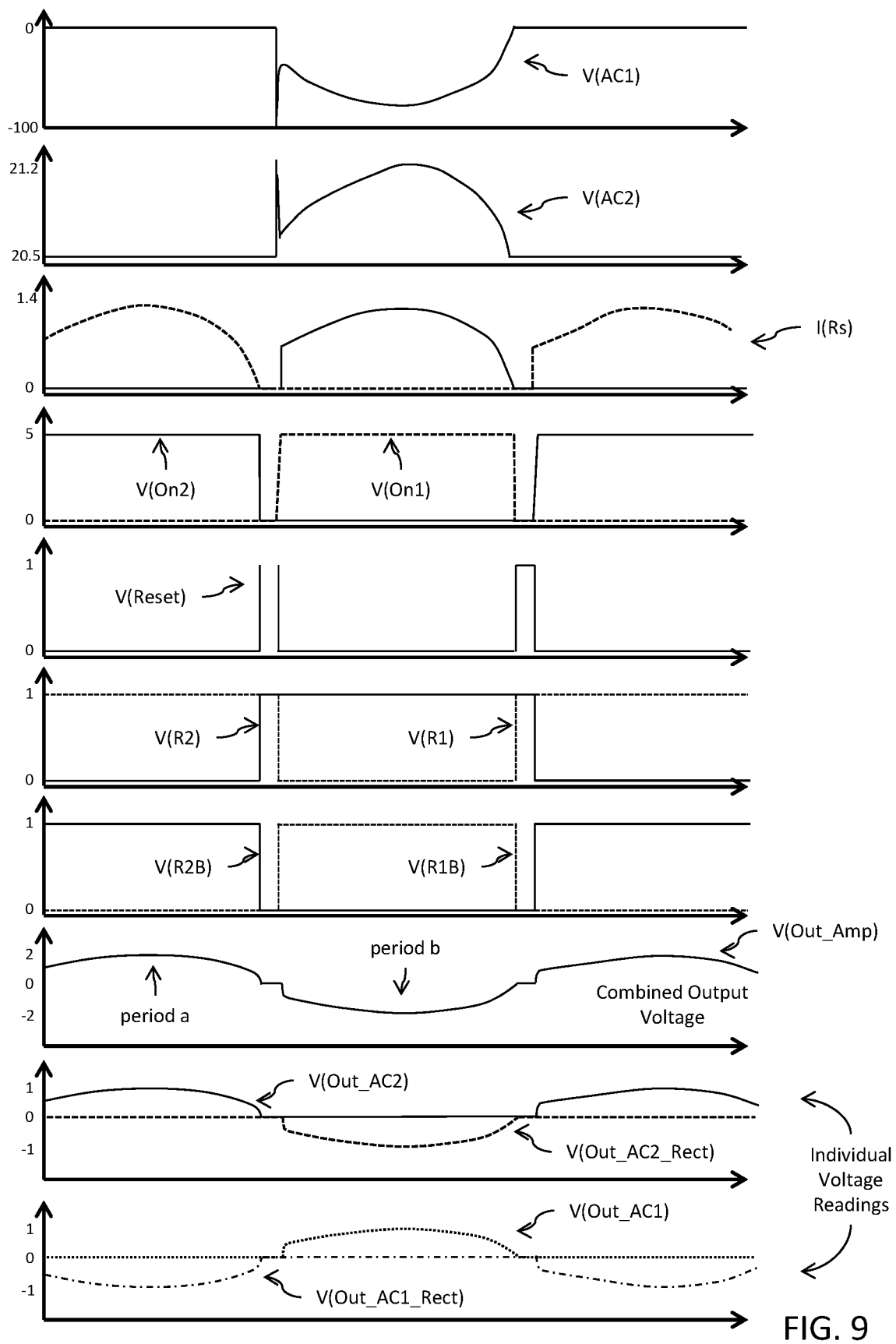

With the implementation of FIGS. 6E-6F, the individual voltages at the rectifier terminals are combined. FIG. 9 shows waveforms illustrating operation of the voltage measurement process. The process implements a cycle-to-cycle power calculation. A first period of the combined output (V(OUT_Amp)) occurs when the signal is positive and this is referred to as "period a" in FIG. 9. A second period of the combined output (V(OUT_Amp)) occurs when the signal is negative and this is referred to as "period b".

With reference to FIG. 10, let $Va_n$ be the n V(t) voltage samples taken during period a, and Let $Vb_n$ be the n V(t) samples taken during period b. Let Vnoise be the amplifier's low-frequency noise (including offset). Let $ka_n$ and $kb_n$ be the samples of k(t). Now, considering the combined output voltage, the power can be calculated by combining cycle-to-cycle power measurements as follows:

$$P = Pa - Pb = I_{avg}\left(\frac{\sum_1^N Va_n * ka_n - \sum_1^N Vb_n * kb_n}{2}\right)$$

when $$Va = V_{AC} + V_{noise}, Vb = -V_{AC} + V_{noise}, \text{ and}$$

$$ka = \frac{V_{AC} + V_{noise}}{\overline{V_{AC} + V_{noise}}} \text{ and } kb = \frac{-V_{AC} + V_{noise}}{\overline{-V_{AC} + V_{noise}}}$$

Thus:

$$P = 0.5 * I_{avg}\left(\frac{\begin{array}{c}(V_{AC1} + V_{noise})(V_{AC1} + V_{noise}) + \cdots + \\ (V_{ACn} + V_{noise})(V_{ACn} + V_{noise})\end{array}}{\overline{V_{AC} + V_{noise}}} - \frac{\begin{array}{c}(-V_{AC1} + V_{noise})(-V_{AC1} + V_{noise}) + \cdots + \\ (-V_{ACn} + V_{noise})(-V_{ACn} + V_{noise})\end{array}}{\overline{-V_{AC} + V_{noise}}}\right)$$

For simplicity, assume that only one sample is taken, and assume that $V_{AC} \gg V_{noise}$, hence:

$$P = 0.5 * I_{avg}\left(\frac{(V_{AC1} + V_{noise})(V_{AC1} + V_{noise})}{\overline{V_{AC}}} - \frac{(-V_{AC1} + V_{noise})(-V_{AC1} + V_{noise})}{\overline{-V_{AC}}}\right)$$

$$= 0.5 * I_{avg}\left(\frac{V_{AC1}^2 + V_{AC1} * V_{noise} + V_{noise}^2 + V_{AC1}^2 - V_{AC1} * V_{noise} + V_{noise}^2}{\overline{V_{AC}}}\right)$$

$$= 0.5 * I_{avg}\left(\frac{2V_{AC1}^2 + 2V_{noise}^2}{\overline{V_{AC}}}\right)$$

The above expression shows that Vnoise is canceled a first order, however second order noise remains.

Given that the signal alternates positive-negative within one period, a correlated double sampling (CDS) technique can be performed prior to the power calculation. The sampling operation is illustrated in FIG. 10. The noise is cancelled by subtracting cycle A, data n with cycle B, data n of each sample (marked with an "x") between first period a and the second period b. For example, $V_{A1}+V_{noise}-(V_{B1}+V_{noise})$. Then the power calculation is performed. The advantage of this is that low-frequency noise is totally removed as per a conventional chopper.

$$P = Pa - Pb = I_{avg}\left(\frac{\sum_1^N Va_n * ka_n - Vb_n * kb_n}{2}\right)$$

when $Va = V_{AC} + V_{noise}$, $Vb = -V_{AC} + V_{noise}$, and $ka = \dfrac{V_{AC} + V_{noise}}{\overline{V_{AC} + V_{noise}}}$ and $kb = \dfrac{-V_{AC} + V_{noise}}{\overline{-V_{AC} + V_{noise}}}$ However, this method relies on fact that the signal is symmetrical and has a 50% duty cycle. If the duty cycle is not 50%, then the number of samples can be different and the method is not perfectly efficient.

To address this, the control signals 18 are modified so that the original signal transforms into improved signal as shown in FIG. 11. It will be noted that the polarity of cycle B is inverted, and in the following operation the polarity of cycle A (referred to as cycle C) is inverted. This selective inversion is implemented through appropriate application of the control signals to the switching circuits of the voltage reader.

Now:

$$P1 = Pa - Pc = I_{avg}\left(\frac{\sum_1^N Va_n * ka_n - Vc_n * kc_n}{2}\right)$$

when $Va = V_{AC} + V_{noise}$, $Vb = -V_{AC} + V_{noise}$, and $ka = \dfrac{V_{AC} + V_{noise}}{\overline{V_{AC} + V_{noise}}}$ and $kb = \dfrac{-V_{AC} + V_{noise}}{\overline{-V_{AC} + V_{noise}}}$ and furthermore:

$$P2 = Pb - Pd = I_{avg}\left(\frac{\sum_1^N (Vb_n * kb_n - Vd_n * kd_n)}{2}\right)$$

when $Va = V_{AC} + V_{noise}$, $Vb = -V_{AC} + V_{noise}$, and $ka = \dfrac{V_{AC} + V_{noise}}{\overline{V_{AC} + V_{noise}}}$ and $kb = \dfrac{-V_{AC} + V_{noise}}{\overline{-V_{AC} + V_{noise}}}$ De-chopping is then performed by subtracting "cycle A, data n with cycle C, data n" and subtracting "cycle B, data n with cycle D, data n". Then, the power computation is performed. This allows a total cancelation of the low frequency noise despite the fact that the signal is not symmetrical between cycle A and cycle B.

To summarize, the process involves: reading voltage drops through high voltage (HV) AC coupling; amplifying in the low voltage (LV) domain with a combined synchronized auto-zeroed amplifier; implementing a period-to-period chopping; using correlated double sampling; using de-chopping; converting with an ADC to obtain n voltage samples per TX period; computing average voltage Vavg; reading average current Iavg; and computing power dissipation from Vavg, Iavg, and n voltage samples.

Figure 13:
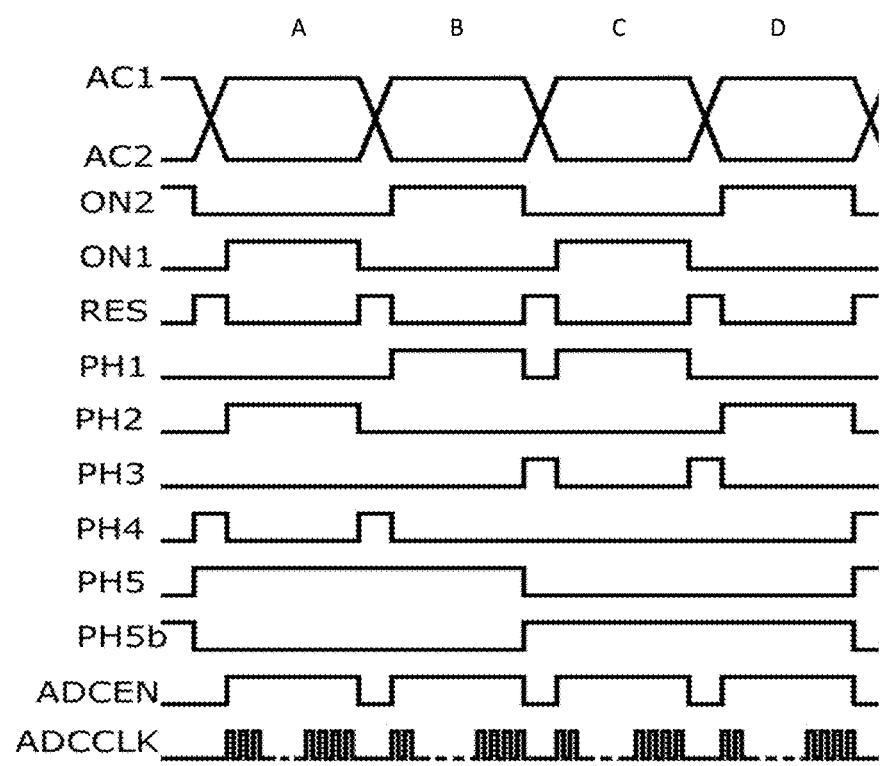
FIG. 13 shows a timing diagram for operation of the circuit shown in FIG. 12.

In a third implementation, as shown in FIG. 12, the voltage reading circuit V_READ comprises a combined synced auto-zeroed amplifier circuit for making the V(RECT,AC1), V(AC2,GND), V(RECT,AC1) and V(AC1,GND) voltage measurements. An advantage of this implementation over the circuit of FIGS. 6E-6F is a reduction in the number of input capacitors. A timing diagram for the control signals for operation of the voltage reading circuit is shown in FIG. 13. As an example of the operation, during Period A: AC1 is low, AC2 is high, PHI2 is high and PH5 is high. In this condition, the differential amplifier input sees (AC2−VRECT)−(AC1−GND). As another example, during Period C: AC1 is low, AC2 is high, PHI1 is high, and PH5*b* is high. In this condition, the differential amplifier input sees (AC1−GND)−(AC2−VRECT). An advantage of this operation is that the samples during Period C can be subtracted from the samples during Period A to reconstruct the signal while removing noise.

The differential amplifier is periodically reset in response to the RES signal (for example, in response to the logical combination of the ON1 and ON2 signals.

The timing diagram of FIG. 13 further shows the timing of the operation of the analog-to-digital converter (ADC) circuit, which is enabled by the signal ADCEN and clocked by the signal ADCCLK, to sample the combined voltage signal output from the amplifier.

In receive (RX) mode the rectifier may operate as half synchronous or asynchronous. The measurement circuitry and processing method is usable provided that each amplifier gain is set properly, as the voltage amplitude read is significantly higher in this mode. Moreover when the rectifier does operate in synchronous mode, it may punctually be in diode conduction mode during a short time at every period. As during this period the voltage is also higher (Vdiode versus Rdson*I), it may be advantageous that the voltage amplifier embeds some means for adjusting its own gain (AGC or other means).

Also as the duration of the diode conduction is short during every period, it may also be advantageous to keep the amplifier RESET during that time and read the voltage only once the rectifier is full synchronous. In such case the power estimation error can be simply compensated by computation given that the information lost is Vdiode*Iavg and pro-rated by a certain coefficient and by the time the diode in ON across the full period. This is part of the proper tuning of the implementation.

Finally, the measurement circuitry can be used for measuring the power dissipation in TX mode (transmitter mode) as well as obviously the signal required for operating the measurement circuitry are the control signals of the bridge.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit for measuring power dissipation in a voltage rectifier, wherein the voltage rectifier comprises four MOSFET transistors arranged in a bridge with a first input terminal, a second input terminal, a first output terminal and a second output terminal, the circuit comprising:
   a current sensing circuit configured to sense current delivered from the first output terminal of the rectifier towards a load; and
   a voltage measurement circuit configured to sense a voltage drop across each MOSFET transistor in the bridge, wherein the sensing of the voltage drop across the MOSFET transistor is made synchronous with actuation of that MOSFET transistor during a rectification mode operation for the voltage rectifier; and a processing circuit configured to calculate power dissipation from the sensed current and the sensed voltage drops.

2. The circuit of claim 1, wherein the current sensing circuit comprises:
a sense resistor coupled between the first output terminal and the load; and
a differential amplifier having a first input coupled to one terminal of the sense resistor and a second input coupled to a second terminal of the sense resistor.

3. The circuit of claim 1, wherein the voltage sensing circuit comprises:
a differential amplifier having a first input, a second input and an output;
a first input capacitor coupled between a first terminal of the MOSFET transistor and the first input;
a second capacitor coupled between a second terminal of the MOSFET transistor and the second input; and
a feedback capacitor coupled between the output and the first input.

4. The circuit of claim 3, further comprising a first switch coupled in parallel with the feedback capacitor and configured to be actuated to reset the voltage sensing circuit.

5. The circuit of claim 4, further comprising a second switch coupled to select between the first terminal of the MOSFET transistor and the second terminal of the MOSFET transistor for connection to the first input of the differential amplifier through the first input capacitor, wherein the second switch is configured to be actuated to select the second terminal of the MOSFET transistor simultaneous with actuation of the first switch.

6. The circuit of claim 5, wherein the second switch is configured to be actuated to select the first terminal of the MOSFET transistor simultaneous with actuation of the MOSFET transistor during rectification mode operation.

7. The circuit of claim 1, wherein the voltage sensing circuit comprises:
a differential amplifier having a first input, a second input, a first output and a second output;
a first input capacitor coupled between a first terminal of the MOSFET transistor and the first input;
a second capacitor coupled between a second terminal of the MOSFET transistor and the second input;
a first feedback capacitor coupled between the first output and the first input; and
a second feedback capacitor coupled between the second output and the second input.

8. The circuit of claim 7, further comprising:
a first switch coupled in parallel with the first feedback capacitor;
a second switch coupled in parallel with the second feedback capacitor; and
wherein the first and second switches are configured to be actuated to reset the voltage sensing circuit.

9. The circuit of claim 8, further comprising a third switch coupled to select between the first terminal of the MOSFET transistor and the second terminal of the MOSFET transistor for connection to the first input of the differential amplifier through the first input capacitor, wherein the third switch is configured to be actuated to select the second terminal of the MOSFET transistor simultaneous with actuation of the first and second switches.

10. The circuit of claim 9, wherein the third switch is configured to be actuated to select the first terminal of the MOSFET transistor simultaneous with actuation of the MOSFET transistor during rectification mode operation.

11. The circuit of claim 1, wherein the processing circuit comprises:
an analog-to-digital controller configured to convert the sensed current and sensed voltage drop to digital values; and
a signal processing circuit configured to determine power dissipation in the rectifier circuit from the digital values.

12. A method for measuring power dissipation in a voltage rectifier formed by four MOSFET transistors arranged in a bridge with a first input terminal, a second input terminal, a first output terminal and a second output terminal, the method comprising:
sensing current delivered from the first output terminal of the rectifier towards a load;
sensing a voltage drop across each MOSFET transistor in the bridge;
wherein sensing of the voltage drop across the MOSFET transistor is performed synchronous with actuation of that MOSFET transistor during a rectification mode operation for the voltage rectifier; and
calculating power dissipation from the sensed current and the sensed voltage drops.

13. The method of claim 12, wherein calculating comprises:
converting the sensed current and voltage drops to digital values; and
digital signal processing of the digital values to determine power dissipation in the rectifier circuit.

14. The method of claim 12, wherein sensing current circuit comprises measuring a voltage difference across a sense resistor coupled between the first output terminal and the load.

15. The method of claim 12, wherein the sensing the voltage drop comprises:
resetting a voltage sensing circuit to a voltage at a first terminal of the MOSFET transistor;
selectively coupling the voltage sensing circuit to receive a voltage at the second terminal of the MOSFET transistor; and
using the voltage sensing circuit to determine a difference between the voltages.

16. The method of claim 15, wherein the voltage sensing circuit is a single-ended output amplifier circuit generating the voltage drop.

17. The method of claim 15, wherein the voltage sensing circuit is a differential output amplifier circuit generating the voltage drop.

18. The method of claim 15, wherein resetting and selectively coupling are performed during a time period when the MOSFET transistor is actuated.

* * * * *